United States Patent [19]
Kang

[11] Patent Number: 6,163,581
[45] Date of Patent: Dec. 19, 2000

[54] LOW-POWER STATE-SEQUENTIAL VITERBI DECODER FOR CDMA DIGITAL CELLULAR APPLICATIONS

[75] Inventor: Inyup Kang, San Diego, Calif.

[73] Assignee: The Regents of the University of California, Oakland, Calif.

[21] Appl. No.: 09/072,654

[22] Filed: May 5, 1998

Related U.S. Application Data

[60] Provisional application No. 60/045,713, May 5, 1997.

[51] Int. Cl.$^7$ ...................................................... H03D 13/41
[52] U.S. Cl. ........................ 375/341; 375/262; 375/265; 704/242; 714/795
[58] Field of Search .................................... 375/262, 265, 375/341; 714/795; 704/242

[56] References Cited

U.S. PATENT DOCUMENTS 6,009,127  12/1999  Piirainen .................................. 375/341

OTHER PUBLICATIONS

Inyup Kang and Alan N. Willson, Jr., "A Low–Power State–Sequential Viterbi Decoder for CDMA Digital Cellular Applications," IEEE, 1996, pp. 272–275.

Andrew J. Viterbi, "Error Bounds for Convolutional Codes and an Asymptotically Optimum Decoding Algorithm," IEEE Transactions on Information Theory, vol. IT–13, No. 2, Apr. 1967, pp. 260–269.

Jim K. Omura, "On the Viterbi Decoding Algorithm," IEEE Transactions on Information Theory, Jan. 1969, pp. 177–179.

G. David Forney, Jr., "The Viterbi Algorithm," Proceedings of the IEEE, vol. 61, N. 3, Mar. 1973, pp. 268–278.

Gerhard Fettweis and Heinrich Meyr, "High–Speed Parallel Viterbi Decoding: Algorithm and VLSI–Architecture," IEEE Communications Magazine, May 1991, pp. 46–55.

Peter J. Black and Teresa H. Meng, "A 140–Mb/s, 32–State, Radix–4 Viterbi Decoder," IEEE Journal of Solid–State Circuites, vol. 27, No. 12, Dec. 1992, pp. 1877–1885.

Jerrold A. Heller and Irwin Mark Jacobs, "Viterbi Decoding for Satellite and Space Communication," IEEE Transactions on Communication Technology, vol. COM–19, No. 5, Oct. 1971, pp. 835–848.

(List continued on next page.)

*Primary Examiner*—Stephen Chin
*Assistant Examiner*—Paul N Rupert
*Attorney, Agent, or Firm*—Gates & Cooper

[57] ABSTRACT

A method, apparatus, and a program storage device useful in performing computations to decode a convolutionally coded sequence without resorting the use of switching elements is disclosed. The method comprises the steps of computing a first branch metric between a first input node and an output node, adding a first input path metric to the first branch metric to produce a first candidate output path metric, computing a second branch metric between a second input node and the output node, adding the second branch metric to a second path metric to derive a second candidate output path metric, and configuring a decision bit based upon the parity of the output state node state and upon whether the first candidate output path metric is greater than the second candidate output path metric. In one embodiment, a comparison between the first and the second candidate output path metrics is compared to the parity of the output node by an exclusive OR gate or a table lookup to determine the decision bit. The invention also is described by an apparatus comprising a means for performing these steps and a program storage device tangibly embodying instructions to perform the steps.

19 Claims, 14 Drawing Sheets

OTHER PUBLICATIONS

Andrew J. Viterbi, "Convolutional Codes and Their Performance in Communication Systems," IEEE Transactions on Communications Technology, vol. COM–19, No. 5, Oct. 1971, pp. 751–772.

Charles M. Rader, "Memory Management in a Viterbi Decoder," IEEE Transactions on Communications, vol. COM–29, No. 9, Sep. 1981, pp. 1399–1401.

B.K. Min and N. Demassieux, "A Versatile Architecture for VLSI Implementation of the Viterbi Algorithm," IEEE, V2.15, 1991, pp. 1110–1104.

C. Bernard Shung, et al., "A 30–MHz Trellis Codec Chip for Partial–Response Channels," IEEE Journal of Solid–State Circuits, vol. 26, No. 12, Dec. 1991, pp. 1981–1987.

Robert Cypher and C. Bernard Shung, "Generalized Trace–Back Techniques for Survivor Memory Management in the Viterbi Algorithm," Journal of VLSI Signal Processing, 5, 85–94, 1993, pp. 85–94.

LOW-POWER STATE-SEQUENTIAL VITERBI DECODER FOR CDMA DIGITAL CELLULAR APPLICATIONS

CROSS-REFERENCE TO RELATED APPLICATIONS

This application claims benefit of U.S. provisional application Ser. No. 60/045,713, filed May 5, 1997 by Inyup Kang and entitled "A LOW-POWER STATE-SEQUENTIAL VITERBI DECODER," which application is hereby incorporated by reference herein.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for and by the terms of Contract No. N00014-95-1-0231 awarded by the Office of Naval Research and Contract No. MIP-9201104 awarded by the National Science Foundation.

REFERENCES

This application also cites the following references, each of which is hereby incorporated by reference herein:

Inyup Kang and Alan N. Willson, Jr., "Low Power Viterbi Decoder for CDMA Mobile Terminals," IEEE Journal of Solid State Circuits, Vol. 33, No. 3, pp. 473–482, March 1988;

Inyup Kang and Alan N. Willson, Jr., "A Low-Power State Sequential Viterbi Decoder for CDMA Digital Cellular Applications," 1996 IEEE Symposium on Circuits and Systems, Proceedings of IEEE 1996 International Symposium on Circuits and Systems (ISCAS), Vol. 4, pp. 252–255, May 7, 1996;

A. P. Chandrakasan and R. W. Brodersen, "Minimizing Power Consumption in Digital CMOS Circuits," Proceedings of the IEEE, vol. 83, pp. 498–523, April 1995;

A. J. Viterbi, "Error Bounds for Convolutional Codes and an Asymptotically Optimum Decoding Algorithm," IEEE Transactions on Information Theory, vol. IT-13, pp. 260–269, April 1956;

J. K. Omura, "On Viterbi Decoding Algorithm," IEEE Transactions on Information Theory, vol. IT-15, pp. 177–179, January 1969;

A. V. Aho, J. E. Hopcroft, and J. D. Ullman, The Design and Analysis of Computer Algorithms, Reading, MA: Addison-Wesley, 1974;

G. D. Forney, Jr., "The Viterbi Algorithm," Proceedings of the IEEE, vol. 61, pp. 268–278, March 1973;

G. Fettweis and H. Meyr, "High Speed parallel Viterbi Decoding: Algorithm and VLSI Architecture," IEEE Communication magazine, vol. 29, pp. 46–55, May 1991;

P J. Black and T. H. Meng, "A 140 Mb/s 32 State Radix-4 Viterbi Decoder," IEEE Journal of Solid-State Circuits, vol. 27, pp. 1877–1885, December 1992;

J. Heller and I Jacobs, "Viterbi Decoding for Satellite and Space Communication," IEEE Transactions on Communication Technology, vol. COM-19, pp. 835–848, October 1971;

A. J. Viterbi and J. K. Omura, Principles of Digital Communication and Coding, New York: McGraw-Hill, 1979;

A. J. Viterbi, "Convolutional Codes and Their Performance in Communication Systems, IEEE Transactions on Communication Technology, vol. COM-19, pp. 751–772, October 1971;

C. M. Rader, "Memory Management in a Viterbi Decoder," IEEE Transactions on Communications, COM-29, pp. 1399–1401, September 1981;

B. K. Min and N. Demassieux, "A Versatile Architecture for VLSI Implementation of the Viterbi Algorithm," in Proc. ICASSP, pp. 1101–1104, May 1991;

C. B. Shung, P. H. Siegel, H. K. Thapar, and R. Karabed, "A 30 MHz Trellis Codec Chip for Partial-Response Channels," IEEE Journal of Solid-State Circuits, vol. 26, pp. 1981–1987, December 1991;

A. Chandrakasan, S.Sheng, and R. W. Brodersen, "Low Power CMOS Digital Design," IEEE Journal of Solid-State Circuits, vol. 27, p. 473–484, April 1992;

R. Cypher, and C. B. Shung, "Generalized Traceback Techniques for Survivor Memory Management in the Viterbi Algorithm," in Proc. GLOBECOM, pp. 1318–1322, December 1990; and Qualcomm, Inc., "Proposed EIA/TIA Interim Standard: Wideband Spread Spectrum Digital Cellular System Dual-Mode Mobile Station—Base Station Compatibility Standard," Apr. 21, 1992.

BACKGROUND OF THE INVENTION

1. Field of the Invention

The present invention relates generally to the decoding of convolutionally coded signals, and in particular, to a low-power, state-sequential Viterbi decoder for code division multiple access applications.

2. Description of the Related Art

In recent years, there has been a rapidly increasing demand for battery powered wireless communications. As this demand continues to increase, minimizing decoder power consumption becomes a critical concern.

Code-division multiple access (CDMA) modulation techniques have been widely applied in a variety of wireless communications products, including digital cellular telephones. CDMA is a convolutional coding technique that permits low power broadband transmission and reception of information with reduced interference, increased security, and adaptable channeling.

To support the large channel capacity required in digital cellphone network, a small $E_b/N_o$ signal to noise ratio (SNR) per bit for a given bit error rate (BER) is needed. This requires that channel coding be performed with a relatively large constraint length convolutional code. Unfortunately, decoder computational complexity dramatically increases with convolutional code constraint length. At the same time, the demand for high bandwidth communications is increasing, even for mobile communications. High bandwidth transception requires decoding computations to be performed at extraordinarily high rates. Because of these channel capacity and bandwidth requirements CDMA decoding techniques are typically implemented in special purpose, very large-scale integrated (VLSI) circuits.

The power consumption, circuit size, and throughput of these special purpose VLSI decoders are major design concerns. Power consumption drives battery life, and extended battery life will be a prerequisite in future designs. Circuit size drives the size of the end-user product as well as throughput. It can therefore be seen that there is a need for a size and power efficient convolutional decoder. The present invention satisfies that need.

SUMMARY OF THE INVENTION

To address the requirements described above, the present invention discloses a method, apparatus, and a program storage device useful in performing computations to decode a convolutionally coded sequence. The method eliminates the need for switching elements. The method comprises the steps of computing a first branch metric between a first input node and an output node, adding a first input path metric to the first branch metric to produce a first candidate output path metric, computing a second branch metric between a second input node and the output node, adding the second branch metric to a second path metric to derive a second candidate output path metric, and configuring a decision bit based upon the parity of the output node state and upon whether the first candidate output path metric is greater than the second candidate output path metric. In one embodiment, a comparison between the first and the second candidate output path metrics is compared to the parity of the output node by an exclusive or gate or a table lookup to determine the decision bit. The invention also is described by an apparatus comprising a means for performing these steps and a program storage device tangibly embodying instructions to perform the steps.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Convolutional Coding

Figure 1:
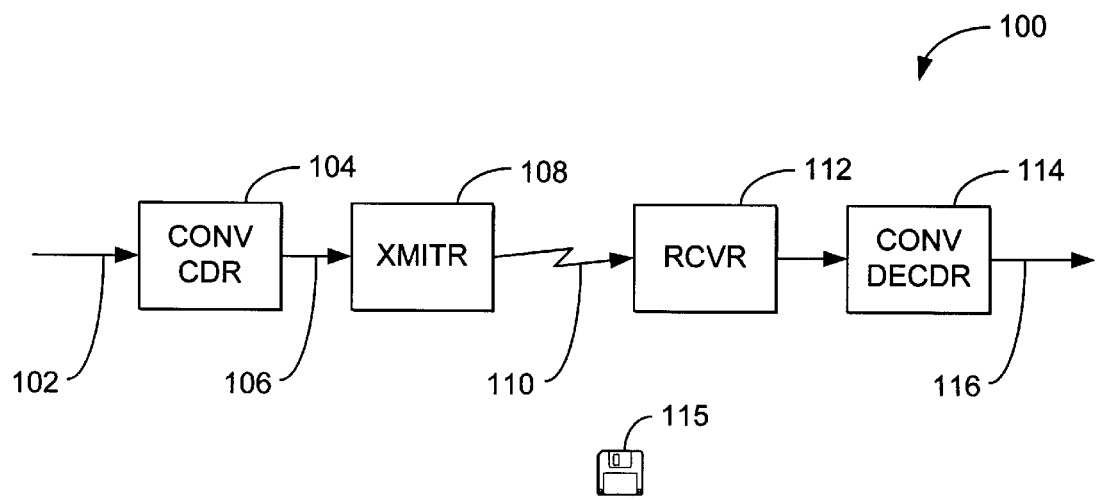
FIG. 1 is a diagram illustrating a communications system using convolutional coding.

FIG. 1 shows a simple block diagram of communications system 100 using convolutional coding. The system takes an input data stream 102 and supplies it to a convolutional coder 104. The convolutional coder 104 provides a convolutionally coded data stream at the coder output 106, which is provided to a transmitter 108. The transmitter 108 performs any necessary processing to broadcast 110 the convolutionally coded datastream. That signal is received by receiver 112, and provided to a convolutional decoder 114. Convolutional decoder 114 translates the received signal into a measured datastream 116.

Operations performed by the convolutional coder 104, transmitter 108, receiver 112, and convolutional decoder 114 can be performed by general purpose processor or similar processing device, and instructions for performing these operations can be stored or otherwise tangibly embodied in a program storage device 115 such as a floppy disk, hard disk, tape, or CD. Such instructions can also be stored in a readable memory accessible to the general purpose processor. The operations can also be performed by special purpose processors and associated components.

Convolutional Coder

Figure 2:
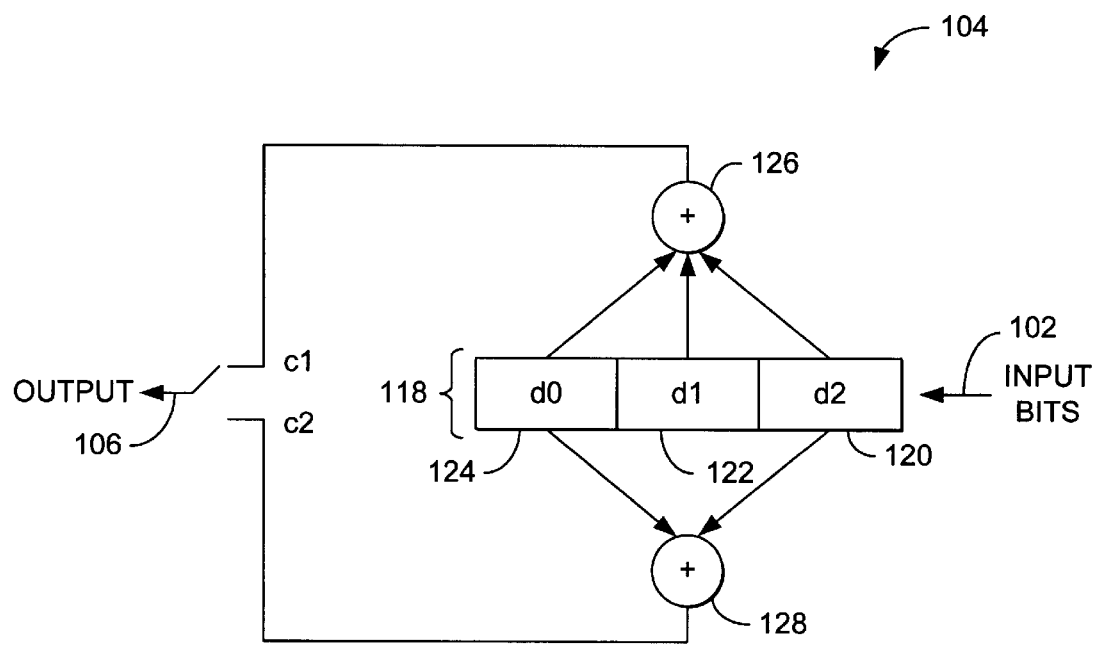
FIG. 2 is a diagram showing a generalized implementation of a convolutional coder.

FIG. 2 is a diagram showing a generalized implementation of convolutional coder 104. Convolutional codes operate on a sliding sequence of input data bits 102 to generate a coded stream of bits at the coder output 106. Although binary convolutional coding is shown in FIG. 1, convolutional codes can also operate on symbol or bit groups.

The convolutional coder 104 generally consists of a K-stage shift register 118, where K is also the constraint length of the coder 104. The convolutional coder 104 of FIG. 1 has a 3-stage shift register 118. Input data bits 102 are shifted into the shift register 118 one bit at a time. Alternating modulo-2 sums computed by exclusive or gates 126 and 128, and are shifted out of the shift register 118 v times as fast, where v is the number of different modulo-2 sums that are coded into the output stream. A coder outputting v bits per input bit is also called a rate 1-/v coder. For every bit that is shifted in, two convolutionally encoded data bits are sequentially read out, with the coder output 106 alternating between $c_1$ and $c_2$. This provides the following logical relationship between $c_1$ and $c_2$:

$c_1 = d_0 \oplus d_1 \oplus d_2$ $c_2 = d_0 \oplus d_2$

Assuming the shift register 118 is initialized with all zeros, this results in the input/output relationship shown in Table 1 below:

TABLE 1

| Time Interval | Input Bits | Output Bits | Output Variable |
|---|---|---|---|
| 1 | 0 | 0 | $c_1$ |
|  |  | 0 | $c_2$ |
| 2 | 1 | 1 | $c_1$ |
|  |  | 1 | $c_2$ |
| 3 | 1 | 0 | $c_1$ |
|  |  | 1 | $c_2$ |

TABLE 1-continued

| Time Interval | Input Bits | Output Bits | Output Variable |
|---|---|---|---|
| 4 | 0 | 0 | $c_1$ |
| — |   | 1 | $c_2$ |
| 5 | 1 | 0 | $c_1$ |
| — |   | 0 | $c_2$ |
| 6 | 0 | 1 | $c_1$ |
| — |   | 0 | $c_2$ |
| 7 | 0 | 1 | $c_1$ |
| — |   | 1 | $c_2$ |
| 8 | 1 | 1 | $c_1$ |
| — |   | 1 | $c_2$ |

For example, at time interval three, leftmost K-1 stages 122 and 124 contain a "0" and a "1." A "1" arriving in interval three produces a "0" and a "1" for $c_1$ and $c_2$ as the two output bits. If a "0" had arrived instead, the output would have been a "1" and a "0," as seen in time interval six.

Figure 3:
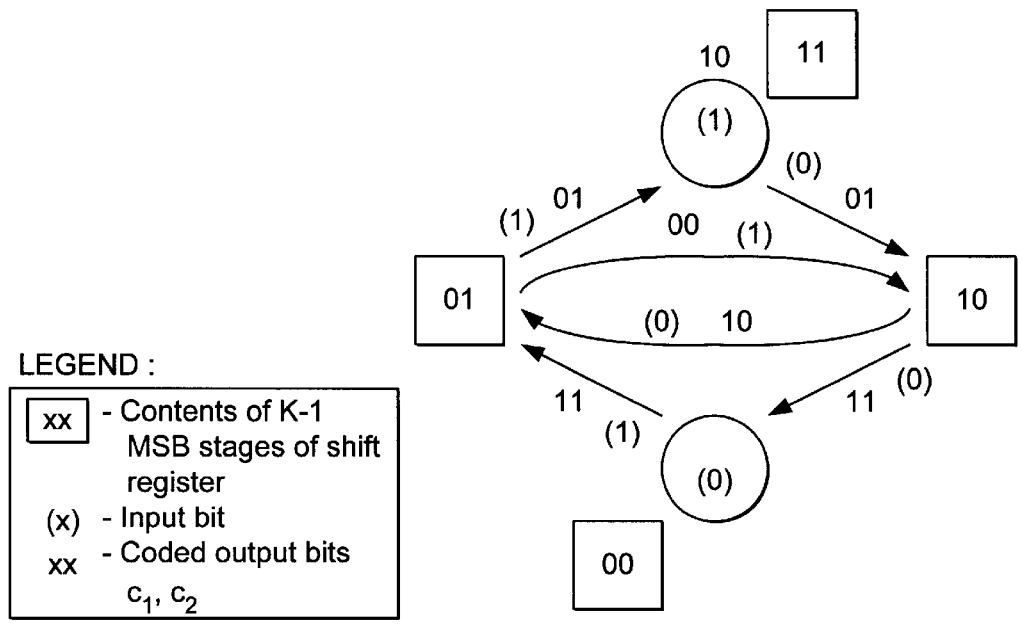
FIG. 3 is a diagram illustrating a state variable representation of the convolutional coder of FIG. 2.

FIG. 3 is an alternative representation of the convolutional coder 104 shown in FIG. 2. In this representation, the convolutional coder 104 is visualized as a finite state machine, moving from one stage, represented by the K-1 shift register contents (which are past input bits) to another. In FIG. 3, the contents of the leftmost K-1 shift registers 122 and 124 are boxed, the input bit 102 is shown in parentheses, and the output bits $c_1$ and $c_2$ are shown next to their respective state transitions.

Figure 4:
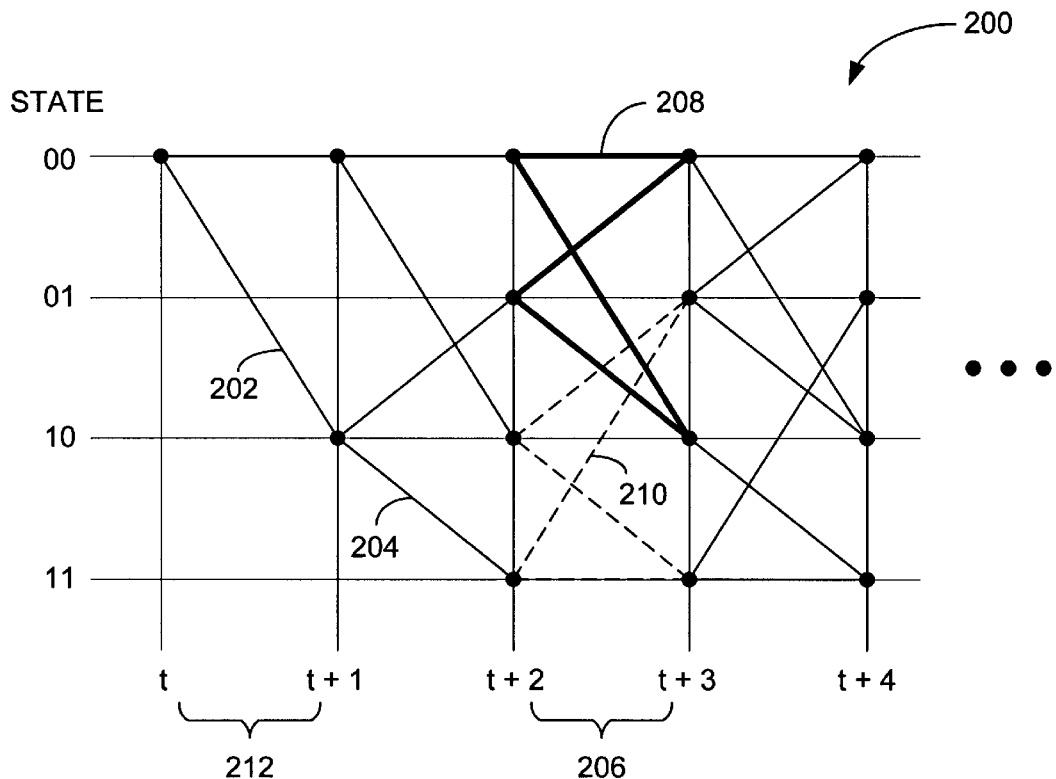
FIG. 4 is a diagram illustrating a trellis.

FIG. 4 is another representation of the logic of convolutional coder 104, as represented by a trellis 200. The geometry of the trellis 200 is determined by the relationship between the input data stream 102 and the content of the shift register 118. In FIG. 4, the shift register is assumed to comprise two registers, and new data from the input data stream is presumed to enter from the left (unlike FIG. 3, in which new data was presumed to enter from the right). Hence, if the present state of the shift registers is 00 (at time t) and the next input bit is a one, as indicated in branch 202, the shift register transitions to the state 10 at time t+1. Similarly, if another 1 is received, the shift register will transition to state 11 at time t+2, as indicated by branch 204. The remaining geometry of the trellis 200 defines the state transition characteristics of the shift registers 118 for all remaining possibilities. For the example illustrated, succeeding trellis stages do not change after trellis stage 206 at time t+3. It is important to note that the structure of the trellis 200 is not dependent on the logic combining the shift registers. That logic instead affects the value of outputs $c_1$ and $c_2$, for each branch.

Trellis stage 206 defines two distinct trellis butterflies, including a first trellis butterfly 208 (indicated with a solid line), and a second trellis butterfly 210 (illustrated with a dashed line). Of course, if there are additional states (more shift registers), additional trellis butterflies are defined.

Viterbi Decoding

Ordinarily, a coded bit stream from the convolutional coder 104 is transmitted by a transmitter 108 to a receiver 112 over a noisy, power limited channel. In addition, both the transmitter 108 and receiver 112 can exhibit non-linearities and other distortions. Consequently, the received convolutional signal is not, in general, an exact duplicate of the transmitted signal. Transmission noise and other errors can cause some of the bits received by the receiver 112 to be decoded improperly, causing one or more bit errors.

Convolutional coding reduces the impact of such errors by introducing a known correlation between measured data. When the coder 104 characteristics are known by the decoder 114, they can be used to determine the most likely input data stream 102 sequence that resulted in the received output sequence. This is the essence of convolutional decoding.

One way of convolutionally decoding the original bit sequence is to compare the received signal with the expected received signal for all of the possible codewords (as if they were perfectly transmitted and received), and to choose the uncoded bit sequence associated with that received codeword combination. For example, consider the sequences shown in Table 2 below:

TABLE 2

| Codewords (coded bit sequences) | Uncoded bit Sequence |
|---|---|
| 00 00 00 00 | 0 0 0 0 |
| 00 00 00 11 | 0 0 0 1 |
| 00 00 11 10 | 0 0 1 0 |
| 00 00 11 01 | 0 0 1 1 |
| 00 11 10 11 | 0 1 0 0 |
| 00 11 10 00 | 0 1 0 1 |
| 00 11 01 01 | 0 1 1 0 |
| 00 11 01 10 | 0 1 1 1 |
| 11 10 11 00 | 1 0 0 0 |
| 11 10 11 11 | 1 0 0 1 |
| 11 10 00 10 | 1 0 1 0 |
| 11 10 00 01 | 1 0 1 1 |
| 11 01 01 11 | 1 1 0 0 |
| 11 01 01 00 | 1 1 0 1 |
| 11 01 10 11 | 1 1 1 0 |
| 11 01 10 10 | 1 1 1 1 |

A simple approach would be to compare the received (coded) data block, compare it to all entries in the table, and pick the closest one (least number of bits differing). This procedure works well for short codewords (here there are only four possible states), but this technique becomes computationally prohibitive as the length of the codeword increases, and as the size of the table increases exponentially. Since relatively large constraint length (K) convolutional codes are required for many commercial applications (including applications to cellular digital phones), this technique is not feasible.

A better technique in such cases is to use a Viterbi decoding algorithm. Like the brute force technique described above, the Viterbi decoding algorithm chooses a codeword with the smallest mean squared distance measure (or, similarly, the highest correlation) to the received vector. Although the Viterbi decoders implementing this technique performs this task without examining the mean squared distance for all possibilities, for relatively long constraint lengths, good results are achieved. This is accomplished by stage-by-stage computation of error distance values for different paths in the trellis 200. Data for previous stages is reflected in two values associated with each output node: path metrics, and decision bits. The decision bit indicates which of the branches from each node of the trellis results in the smaller error distance, and the path metric quantifies the error distance for that path.

Figure 5:
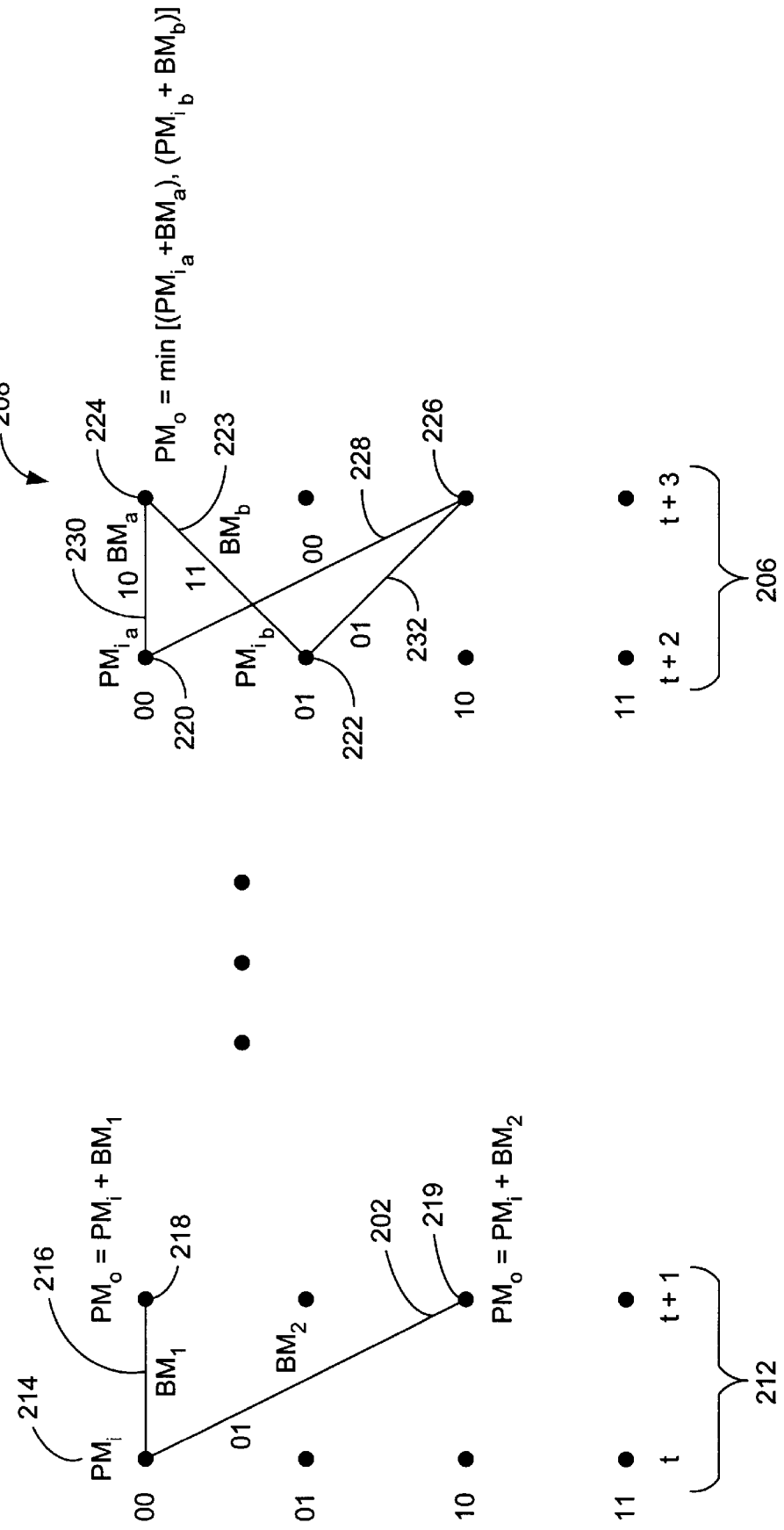
FIG. 5 is a diagram illustrating the application of the Viterbi algorithm to a trellis.

FIG. 5 is a trellis diagram showing the first trellis stage 212 and the first trellis butterfly 208 of the final trellis stage 206 shown in FIG. 3. The first trellis stage comprises an input node 214 and two output nodes 218 and 219, coupled by branches 216 and 202, respectively. Associated with input node 214 and all other nodes is a path metric $PM_i$ which represents the sum of the path and branch metrics leading to input node 214. Since this is the first trellis stage, the path metric for input node 214 is zero.

Branch 216 extends from the input node 214 to first output node 218. Associated with branch 216 is a branch metric $BM_1$. The branch metric represents the difference between the measured codeword (including noise) and the ideal (no noise) value for the codeword in that branch. Branch 216 represents the situation where a zero is received in the input data stream of the shift register 118. After the shift, all of the registers are still zero, so the state of the shift register does not change from t to t+1. Hence, the ideal (no noise) values for $c_1$, $c_0$ should be "00." Because of noise, however, the measured value for the output data $c_1$, $c_0$ will not be "00," but instead another value. For exemplary purposes, if the measured value of the output data is "0.1, 0.01", the branch metric $BM_1$ for this branch will be the error "distance" from (0,0) to (0.1, 0.01).

Path metrics for output nodes 218 and 219 is determined as the sum of the path metric from the previous node and the metric of the branch taken to reach that node. Since the node metric $PM_i$ is zero, the path metric for nodes 218 and 219 are equal to the metrics for branches 216 and 202, respectively.

Path metrics for succeeding trellis stages are determined from the path metrics and branch metrics for the preceding stage. The final trellis stage 206 comprises a first trellis butterfly 208 and a second trellis butterfly 210. First trellis butterfly 208 comprises a first input node 220, coupled to a first output node 224 by a first branch 226, and a second input node 222, coupled to the first output node 224. Similarly, a second input node 222 is coupled to a second output node 226 via branch 232, and to the first output node 224 by branch 223. Recall that the state of the first input node 220 at t+2 "00" and the state of the second input node 222 at t+2 is "01." Also note that at t+3, the state of the first output node 224 is "00" and the state of the second output node 226 is "10."

To compute the path metric for output node 224, the path metric for input node 220 (denoted $PM_{ia}$) is added to the branch metric for branch 230 (denoted $BM_a$). This sum is compared to the sum of the path metric for node 222 (denoted $PM_{ib}$) and the branch metric for branch 223 (denoted $BM_b$). The path metric for node 224 is then calculated as the smaller of the two candidate path metric values:

$$PM_o = \min[(PM_{ia}+BM_a), (PM_{ib}+BM_b)]$$

For each output node, a "decision" is stored. The decision (typically, a bit) designates the branch that resulted in the smallest error for each output node. For example, suppose the following relationship is established:

$$(PM_{ai}+BM_a)<(PM_{bi}+BM_b)$$

In this case, branch 230 is the minimum error path, and a decision bit identifying branch 226 would be stored. Typically, the decision bit is stored according to an arbitrary but consistent paradigm (i.e., the decision bit is set to 1 if the upper branch resulted in the smallest path metric). Of course, in situations where an output state can be reached from more than two input states, more than one bit may be required. Note that the decision bits themselves are sufficient to define the minimum error path. Path metrics need only be stored to compute the path metrics and decision bits for the next trellis stage. Once a path metric for a previous stage has been used, it need not be retained to determine the actual codeword sequence from the measured data. The actual codeword sequence comprises the codewords associated with each branch in the minimum error distance path.

Figure 6:
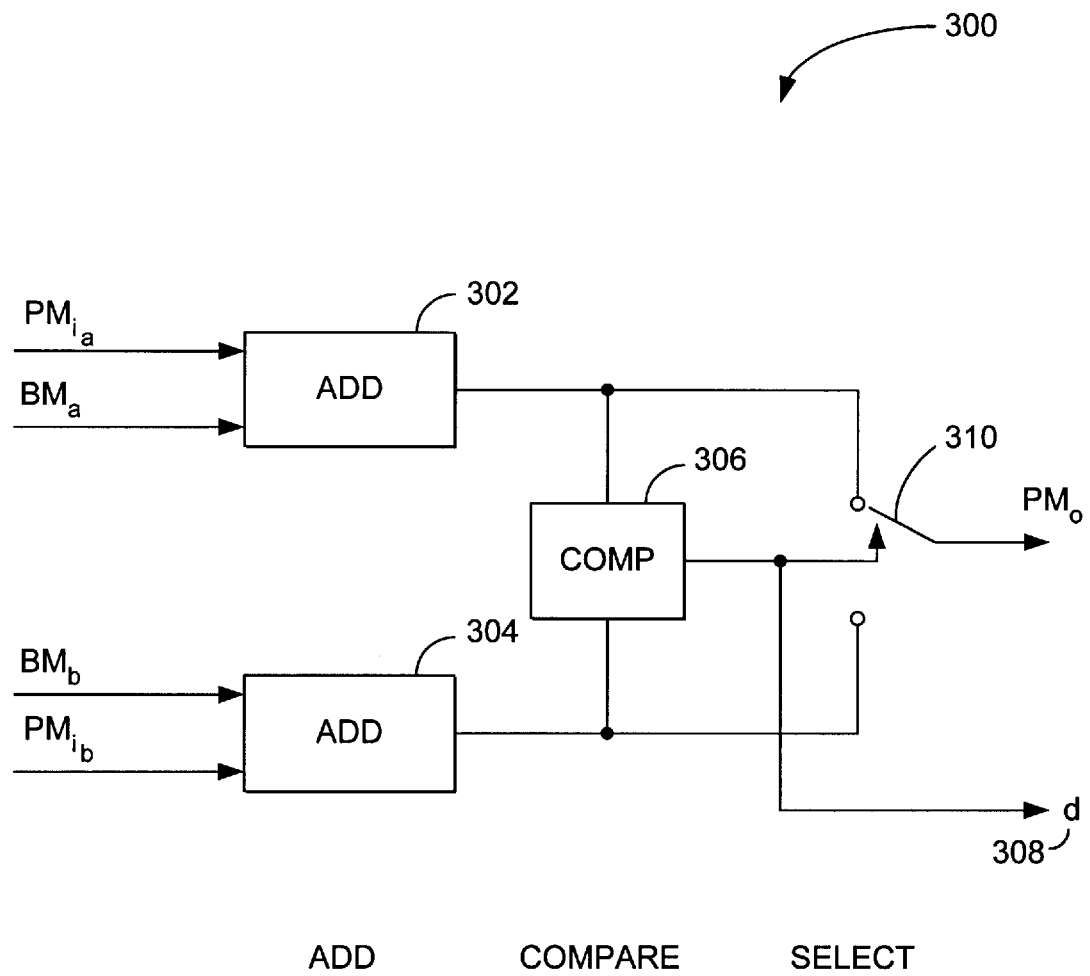
FIG. 6 is a block diagram of an add-compare-select circuit.

FIG. 6 is a block diagram of an add-compare-select (ACS) circuit 300, which is typically used to implement the foregoing process. The ACS circuit 300 comprises a first adder 302 and a second adder 304 for determining the sum of the path metric associated with the input nodes and the branch metrics. Comparator 306 compares the outputs from the first adder 302 and the second adder 304 to determine which is of lesser magnitude. That result is used to derive a decision bit 308 and is also used to control switch 310 which indicates the path metric for the output node.

Note that in FIG. 4, that trellis stage 206 comprises two trellis butterflies, a first trellis butterfly 208 and a second trellis butterfly 210. Generally, the foregoing Viterbi algorithm must be applied to all of the butterflies in the trellis to generate the minimum error distance path. This can be implemented with dedicated circuitry for each butterfly, but this technique would be costly in terms of memory, processors, power consumption, and on-chip area. It is therefore desirable to implement the Viterbi decoder with a single butterfly. This would allow the decoding necessary for the trellis shown in FIG. 4 to be performed with a single ACS circuit.

Figure 7A:
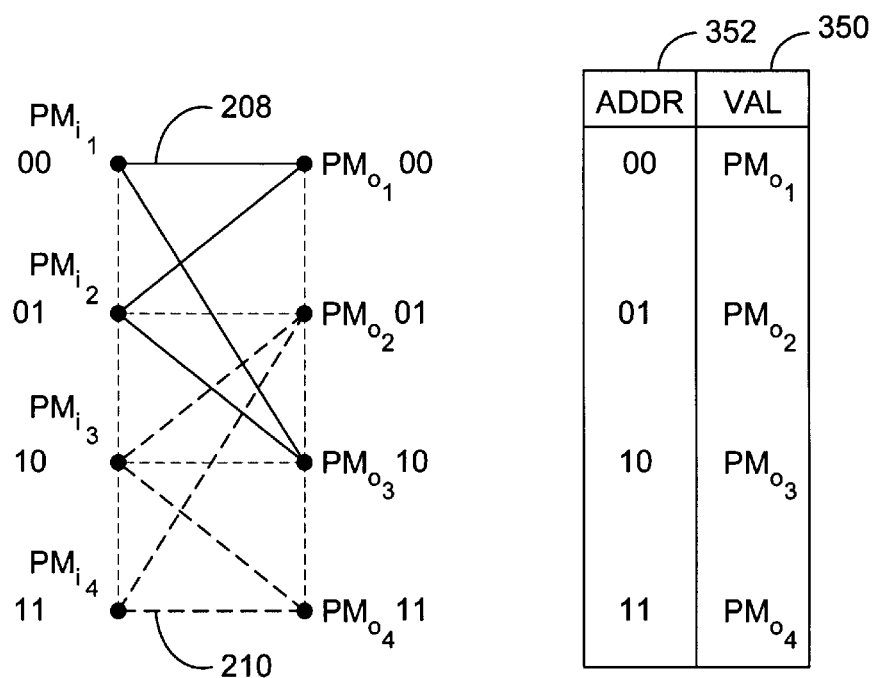
FIG. 7A is a diagram of a trellis stage and associated memory.

FIG. 7A is a diagram showing trellis stage 206 and the path metrics associated with each input node ($PM_{i1}$, $PM_{i2}$, $PM_{i3}$, and $PM_{i4}$, and output nodes ($PM_{o1}$, $PM_{o2}$, $PM_{o4}$ and $PM_{o4}$). To simplify memory addressing circuitry, it is advantageous store the result from each path metric computation in a memory 350 associated with a memory address 352 corresponding to the state associated with that node. Unfortunately, this technique would overwrite data needed for computations on subsequent butterflies. For example, suppose the path metrics $PM_{o1}$ and $PM_{o3}$ are computed for first butterfly 208, and the results stored in a memory addressed by the sate of the associated output nodes. That would mean that $PM_{o3}$ would be stored in the memory addressed by "10," overwriting the path metric $PM_{i3}$ needed to perform the computations for the second butterfly 210.

Figure 7B:
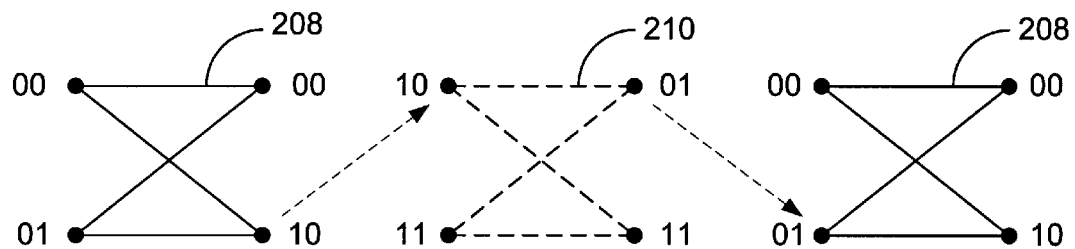
FIG. 7B is a diagram illustrating an overwriting problem for the memories associated with the trellis of FIG. 7A.

FIG. 7B is another diagram illustrating the overwriting problem. Note that the path metric for the "10" output state in trellis butterfly 208 is required at the input state for "10" in trellis butterfly 210. This requires that the path metric computed for output state "10" must be switched to a different input node of trellis 208. Similarly, after the computations for trellis 210 are completed, another switching operation is required to provide the proper path metrics to trellis butterfly 208.

Figure 8:
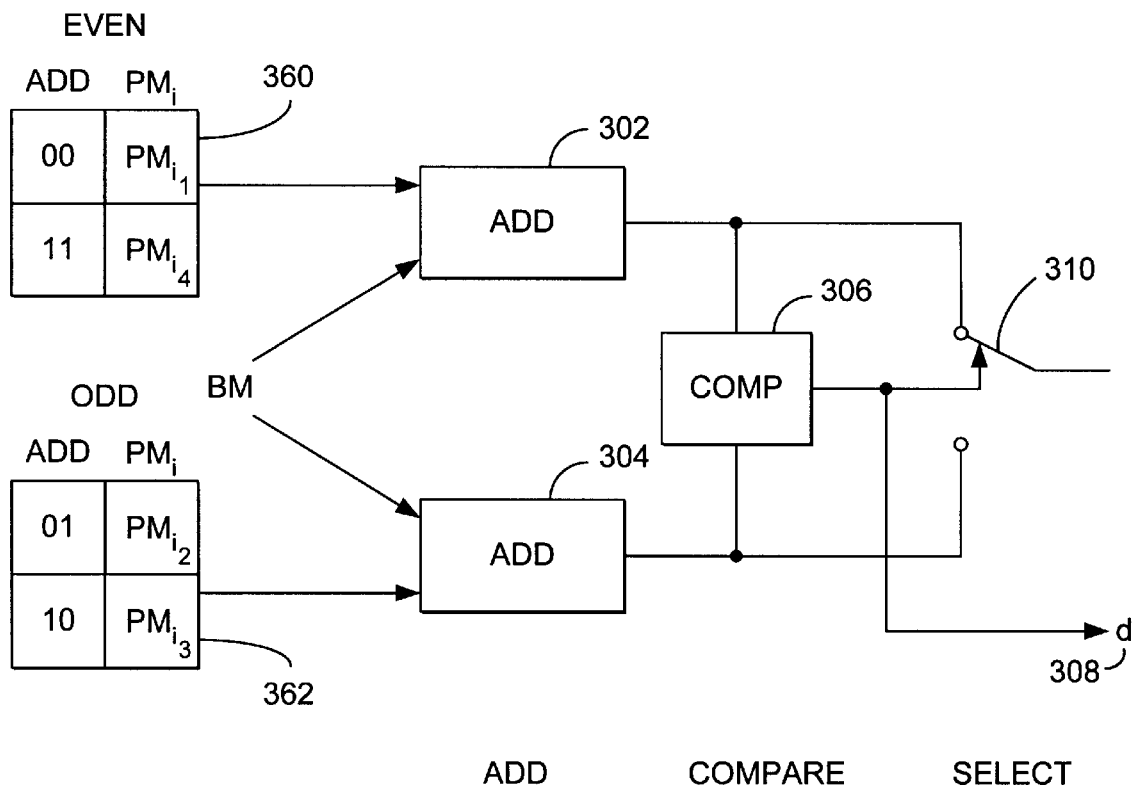
FIG. 8 is a diagram of an add-compare-select circuit with an even/odd parity segmented memory.

FIG. 8 is a diagram of an ACS circuit 300 with an even/odd parity segmented memory. This ACS circuit 300 takes advantage of the even and odd parity relationship (that is, the parity of the "01" and "10" states are odd, and the parity of the "00" and "11" states are even) between output nodes for the first trellis 208 and the second trellis 210. In this implementation, path metrics for even parity states are stored together and at a separate memory from the odd parity states. Here, a first memory 360 comprising even addresses "00" and "11," and a second memory 362 comprising odd addresses "01" and "10" are used to store path metrics. Note, however, that while this arrangement provides the proper input path metrics for the first butterfly 208, it does not do so for the second butterfly 210, because value of $PM_{i3}$ is provided to the second adder 304, instead of the first adder 302. For this reason, this even/odd parity memory segmentation technique requires a means to selectively provide $PM_{i3}$ to the proper adder 302.

Figure 9:
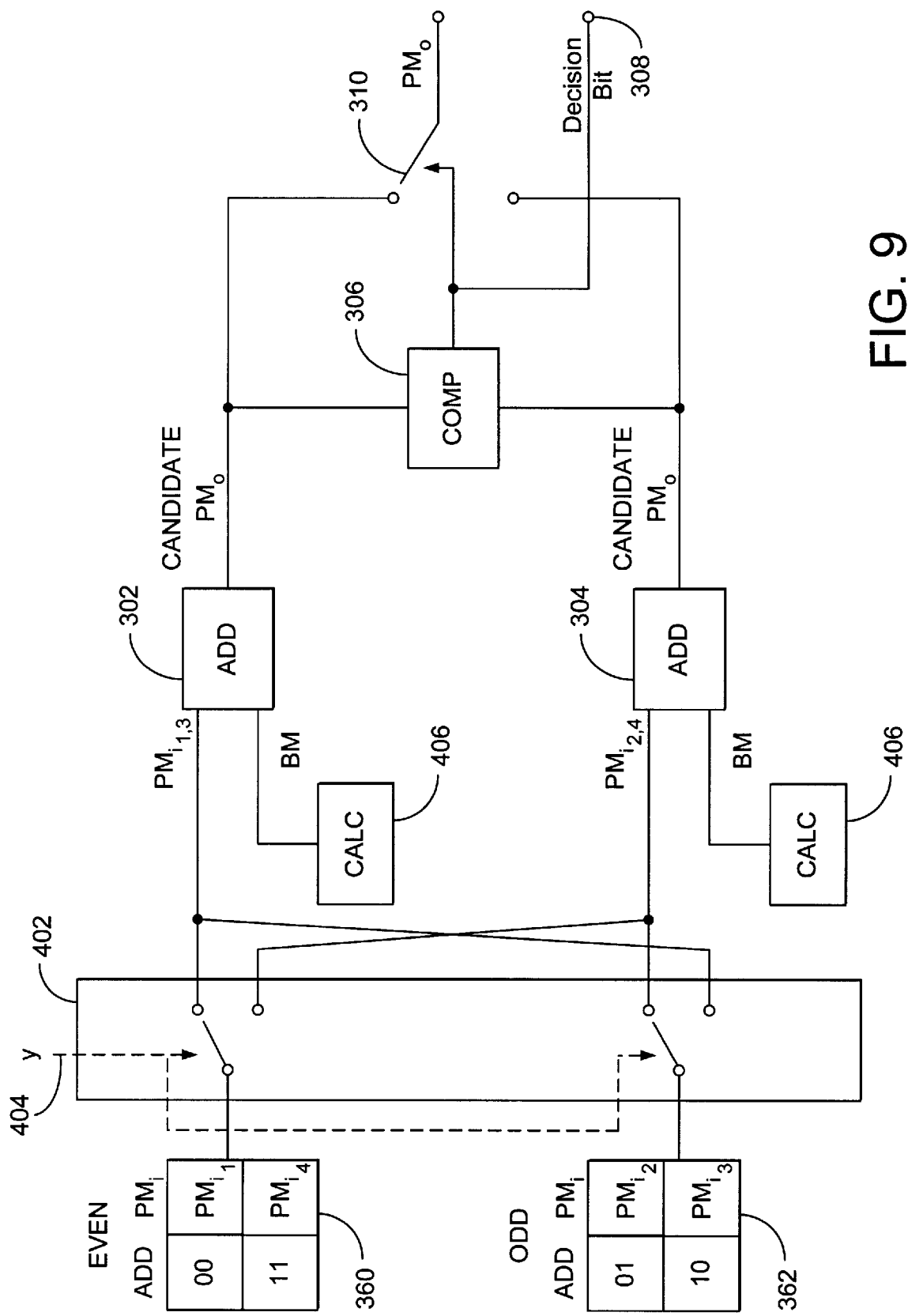
FIG. 9 is a diagram of a switched add-compare-select circuit with an even/odd parity segmented memory.

FIG. 9 shows the ACS and memory implementation of FIG. 8, and includes a switch 402, which selectively provides the input node path metric to the proper place. Switch 402 is controlled by a toggling signal 404 (denoted "y"), which selectively toggles on and off to direct the values stored in the first memory 360 and second memory 362 to the proper adder. In one embodiment, the toggling signal 404 is a parity bit required parity of Xy is even, where Xy denotes the bit y appended to state X (i.e., if the state is 01, the parity bit will be a "1"). This implementation assures that when the path metric computation is switched from the first butterfly 208 to the second butterfly 210, the value of $PM_{i3}$ is not overwritten, and is still provided to the first memory 360. For simplicity, the computations performed to arrive at the branch metrics for each branch are illustrated as being performed by branch metric calculator 406.

Additional circuitry is required to assure that the proper output node path metrics are provided to the memories 360, 362 for subsequent computations. That is because the location of the second butterfly 208 "01" output state must be switched to the second memory 362.

Figure 10A:
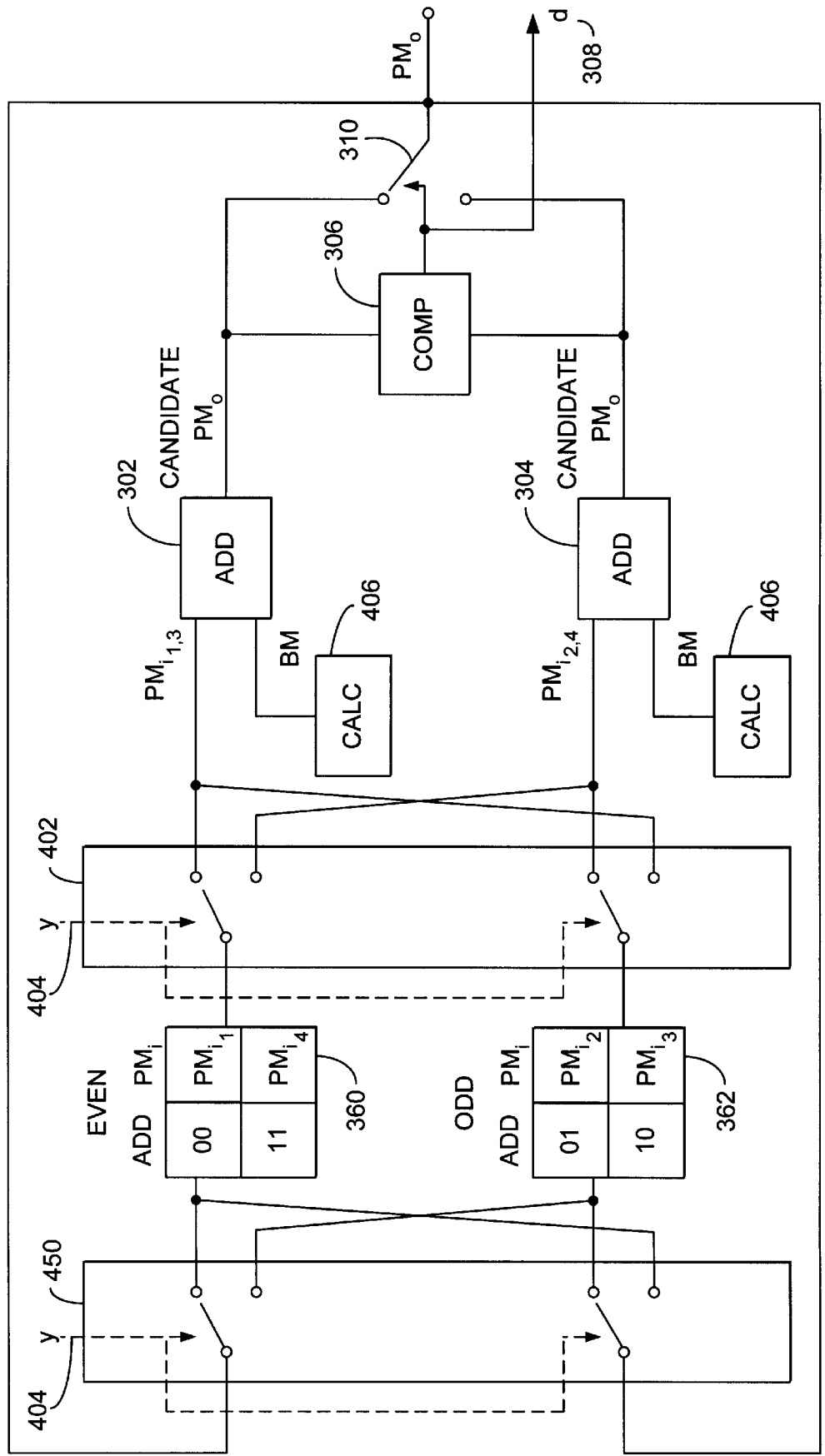
FIGS. 10A and 10B are diagrams of a double-switched add-compare-select circuit with an even/odd parity segmented memory.
Figure 10B:
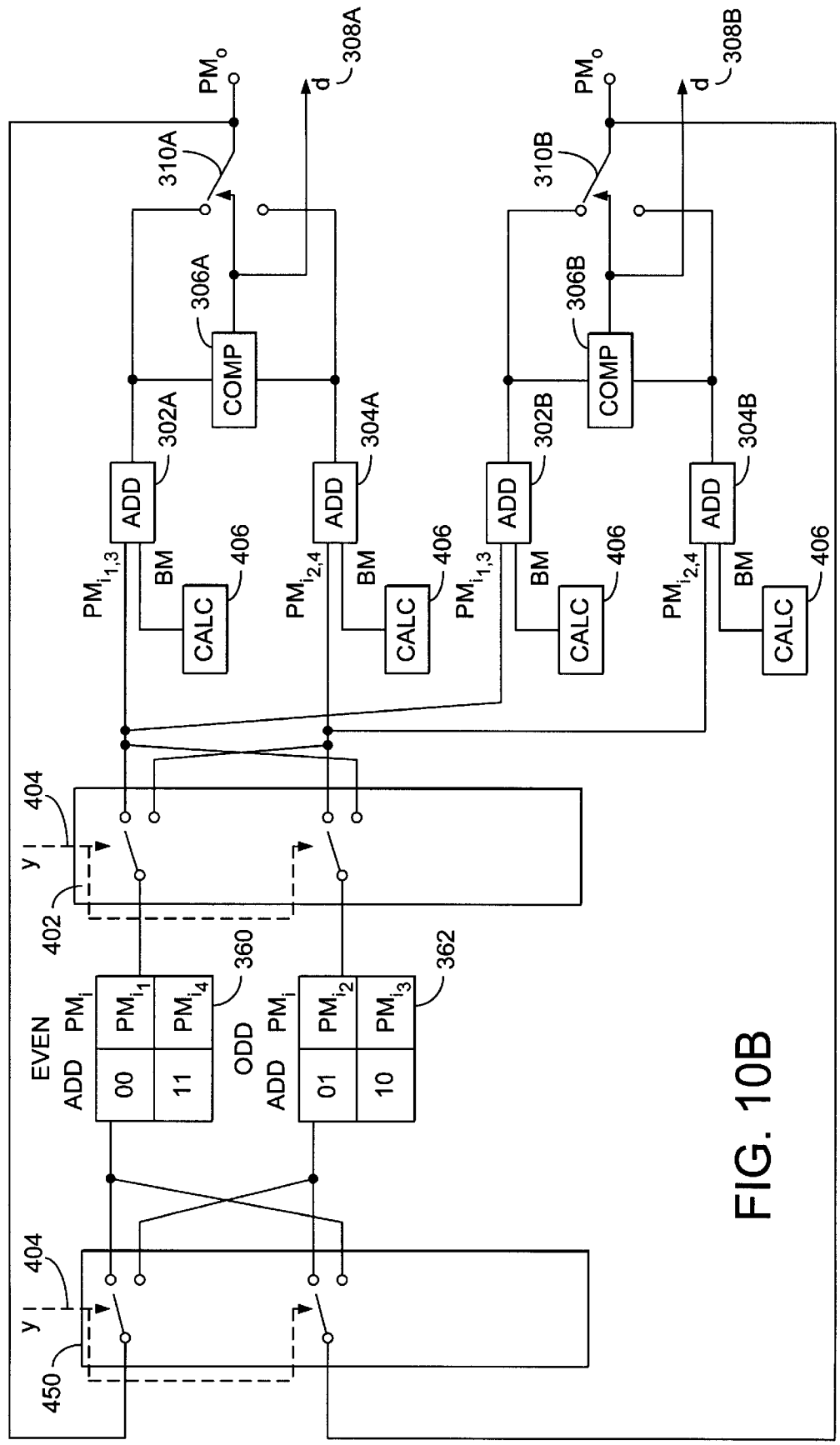

FIG. 10A is a block diagram of the ACS circuit 300 comprising a second switch to switch the output node path metric to the second memory 362. When the output path metrics are supplied to the adders 302 and 304 to perform computations for the next butterfly, second switch responds to the toggling signal 404 to route the output path metric to the second memory 362. This ACS circuit 300 provides the proper path metrics to the proper adders 302 and 304 to perform subsequent path metric computations. Ordinarily, as shown in FIG. 10B, two ACS units are used to implement the trellis state diagram 470. However, as FIG. 10A shows, the two input path metrics can be double buffered and a single ACS can be used twice to perform a single butterfly operation.

Figure 11:
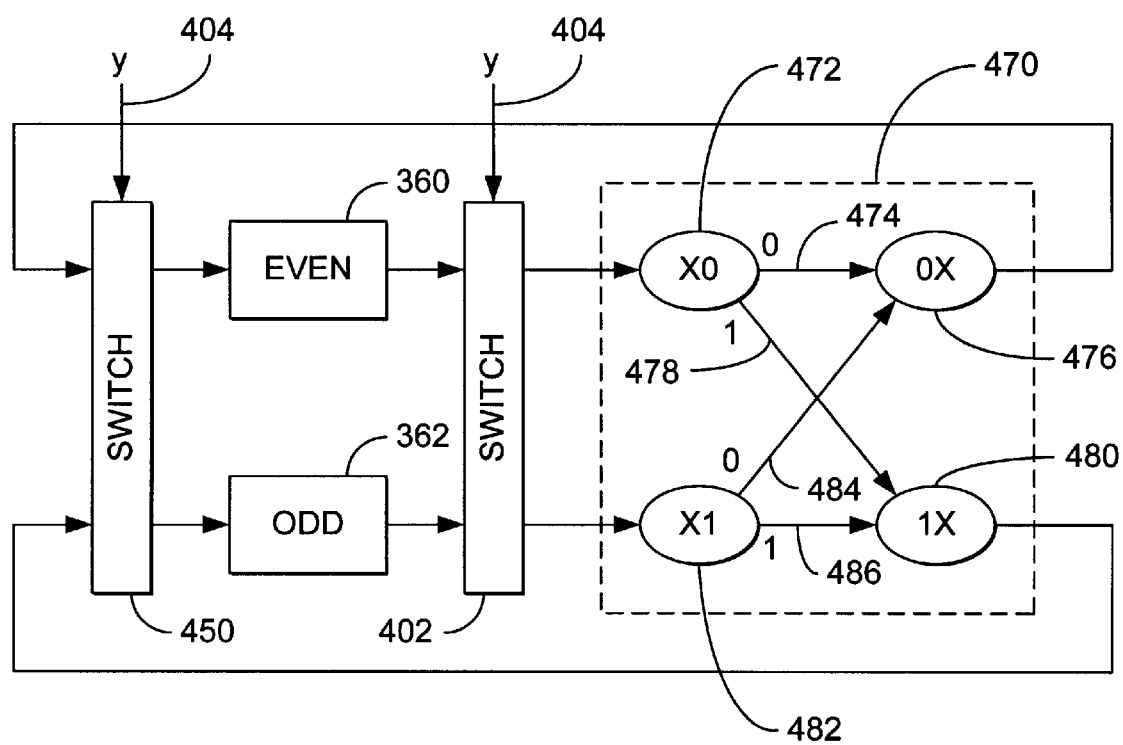
FIG. 11 is a trellis state diagram of a double-switched add-compare-select circuit.

FIG. 11 is a simplified block diagram showing the elements of the modified ACS unit of FIG. 10A, including the first switch 402, second switch 450, first (even parity) memory 360, and second (odd parity) memory 362. A trellis state diagram 470 of the butterfly study is depicted in place of the ACS unit of FIG. 10B. The "X" shown for trellis states 472, 476, 482, and 480 refers to one or more binary digits. From a beginning state of "X0" 472, the trellis transitions to a state of "0X" 476 via branch "0" 474 when a "0" is received as an input. The trellis will transition from "X0" 472 to "1X" 480 along branch 478 if a "1" is received as an input. Similarly, the trellis transitions from the "X1" state 482 to the "0X" state 476 along branch 484 when a "0" is input, and to state "1X" 480 when a "1" is input. A single ACS circuit 300 is used to perform the add, compare, and select operations of FIGS. 10A and 10B, using the switching techniques described above FIGS. 12A and 12B show how the symmetrical relationship of a trellis state diagram is advantageously used to eliminate the switches of FIGS. 10A and 10B. Note that trellis 496 and trellis 498 are symmetrically related, as the transitions from one state to another occur the same way in the same situations. The only difference between trellis 496 and trellis 498 is that the logic of the decision bits 494 and 492 are inverted from those of decision bits 488 and 490. Recalling that the decision bit determines which branch is chosen (the upper branch or the lower branch) note that this inverted relationship exists because of the inverted orientation of trellis 498.

Using the symmetrical trellis properties, the ACS circuit of FIGS. 10A and 10B can be redefined without first switch 402 or second switch 450. These switches are eliminated by advantageous use of the trellis symmetry and the toggling properties of parity bit 404. Logical states 472, 476, 482, and 480 have been redefined in terms of parity bit 404 to logical states 502, 504, 510, and 512, but as is demonstrated herein, that redefinition is accomplished without any additional circuitry.

Figures 12A, 12B:
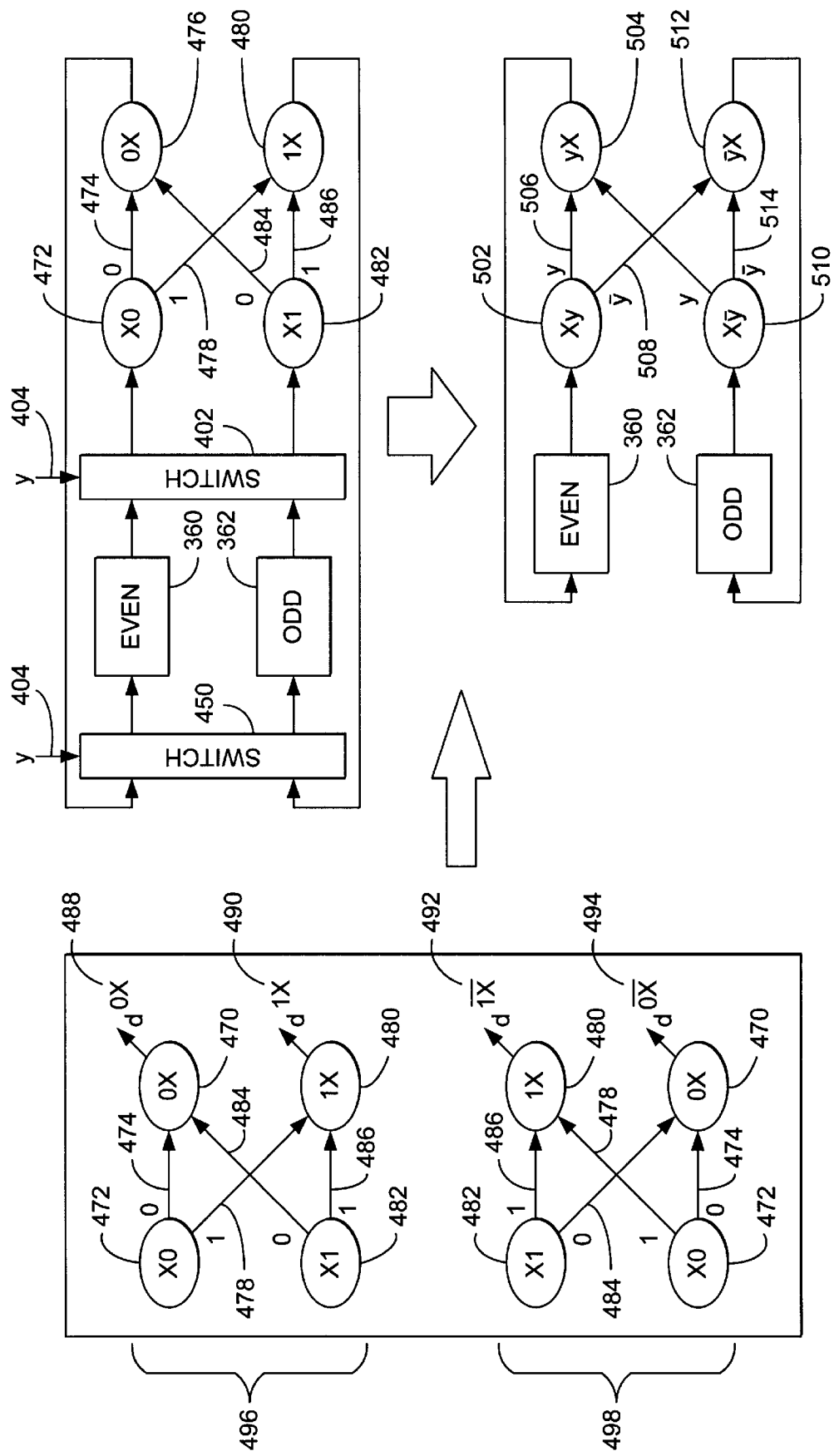
FIGS. 12A and 12B are diagrams showing how the symmetrical relationship of a trellis state can be advantageously utilized to eliminate add-compare-select switching circuits.
Figure 13:
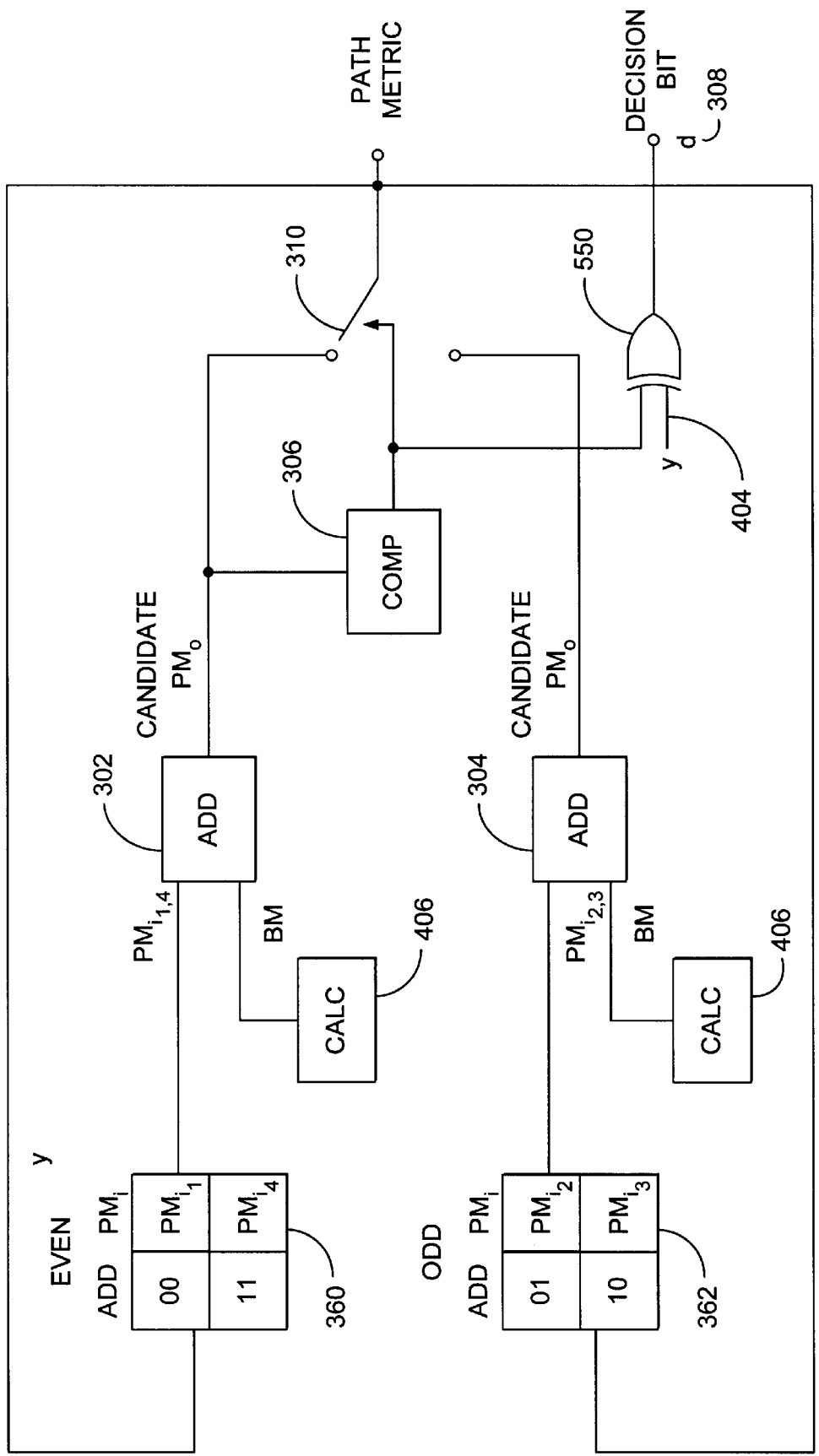
FIG. 13 is a diagram illustrating one hardware implementation of a low power add-compare-select circuit without switching circuitry.

FIG. 13 is a diagram illustrating one hardware implementation of the ACS circuit of FIG. 12B. Note that this configuration dispenses with the first switch 402 and the second switch 405, and provides the path metric inputs directly to the first adder 302 and the second adder 304. The proper logical relationship between the output node path metrics is retained due to the characteristics of parity bit 404. To retain the proper logical relationship with the decision bit, the output of the comparator 302 is not provided directly as a decision bit output. Instead, the output is provided as an input to an exclusive OR (XOR) gate 550. The parity bit 404 is also provided as an input to a decision bit controller such as XOR gate 550, and the toggling characteristics of parity bit "y" 404, assure that the output of the XOR gate 550 describes the proper relationship for the decision bit 308.

The foregoing described how a maximally partitioned trellis (using a single butterfly to perform all ACS operations) ACS unit can be fashioned to perform Viterbi decoding while eliminating the need for two switching networks. These switching networks require space on the VLSI implementing the algorithm, consume power, contribute to path length, and degrade throughput. By eliminating these switching networks, the performance of the convolutional decoder 114 can be significantly improved.

Figure 14:
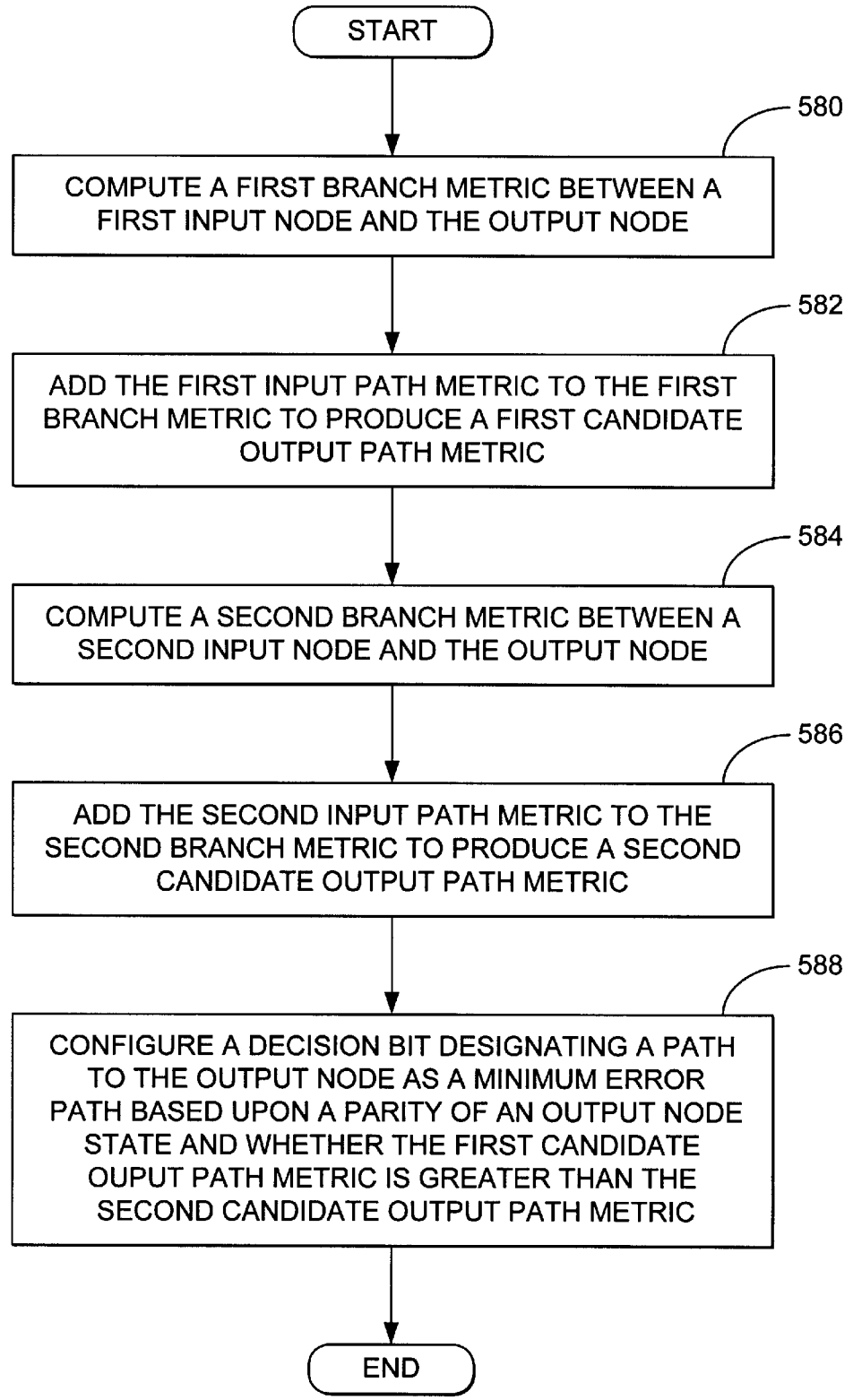
FIG. 14 is a flow chart describing operations used to practice one embodiment of the present invention.

FIG. 14 is a flow chart showing the operations used to practice the present invention. First, a first branch metric between a first input node and an output node is computed 580. Then, the first branch metric is added to the first input path metric to produce a first candidate output path metric. This step is shown in block 582. In block 584, a second branch metric between a second input node and the output node is computed. Then, this value is added 586 to a second input path metric. Finally, a decision bit is configured 588 so as to designate a minimum error path through the trellis. This configuration is bases upon the parity of the state of the output node and which of the two candidate output path metrics is larger.

Instructions for performing the foregoing operations can be tangibly embodied in a program storage device, such as a floppy disk, tape, CD, or other device. These operations are implemented by reading, interpreting and executing the instructions on a computer or other processing device.

MSB and LSB Partitioning

The foregoing example used maximal trellis partitioning, in which a single butterfly unit was used to perform all required computations. Other partitioning schemes are also possible, and are preferred for high-throughput applications. For example, the trellis can be partitioned so that the butterflies with a logical "1" for the most significant bit (MSB) of the input node states can be grouped together. This partitioning (called MSB partitioning) divides the trellis into two partitioned trellises, each with one half the number of butterflies as the unpartitioned case. Least significant bit (LSB) partitioning, wherein the grouping is defined by the LSB of the states is also possible.

Figure 15B:
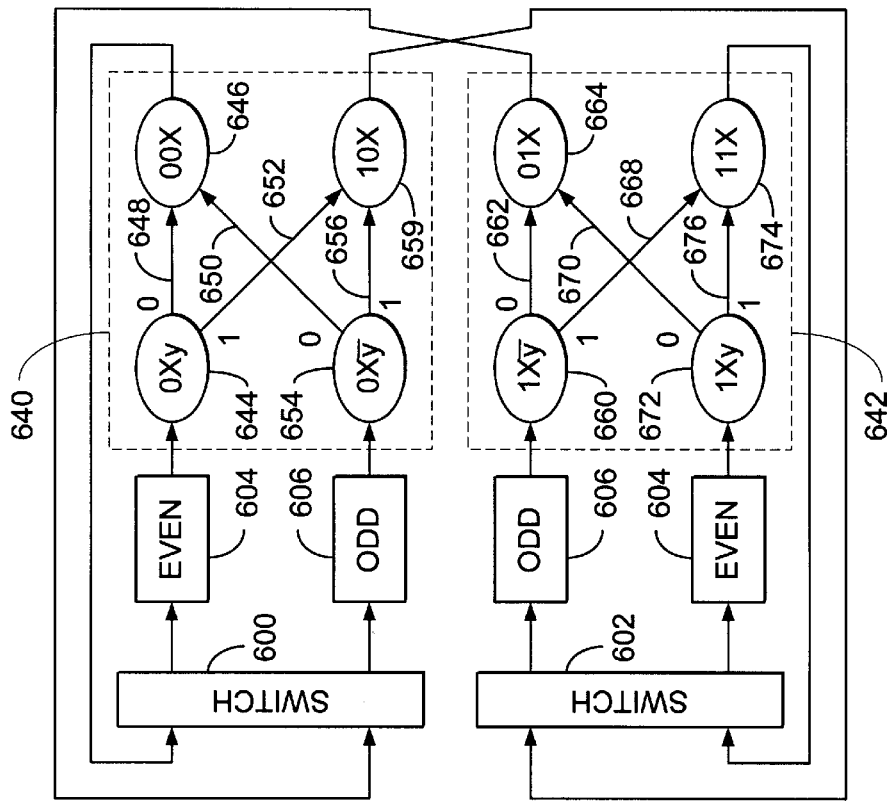
FIGS. 15A and 15B are trellis state diagrams showing alternate MSB partitioned embodiments of the present invention.
Figure 15A:
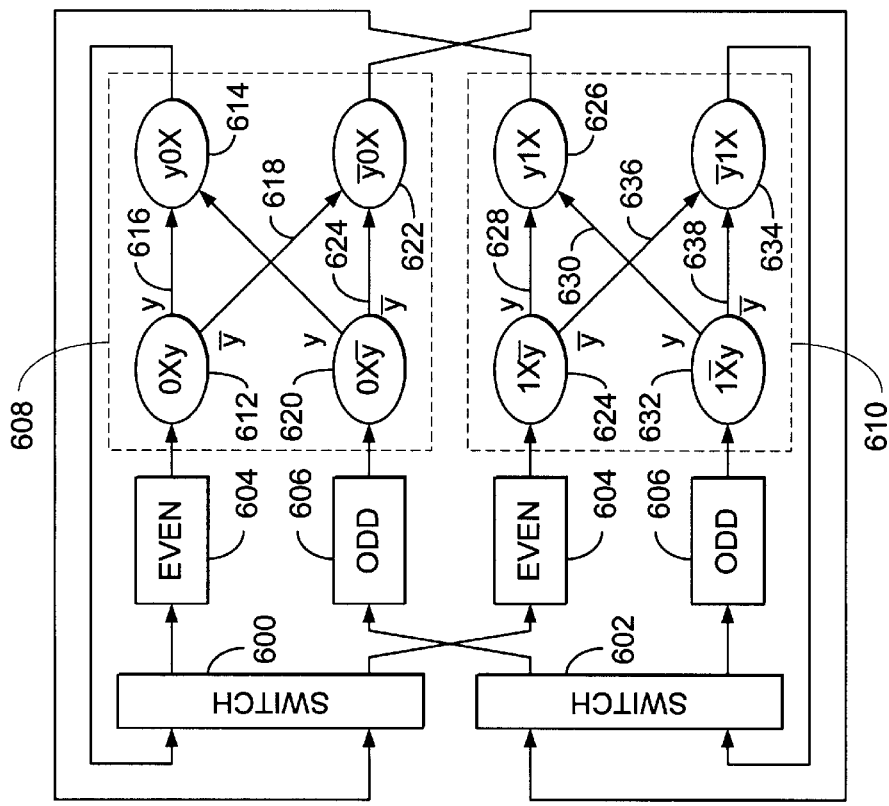

FIG. 15A is a logical diagram showing the use of MSB partitioning. A trellis describing the transition logic of the input stream has been partitioned into first partitioned trellis 608 and second partitioned trellis 610. The MSB of the input states 612 and 620 of trellis 608 are a logical "0," and the MSB of the input states 624 and 632 of trellis 610 are a logical "1." First memory 604 stores path metrics with an even address, and second memory 606 stores path metrics with odd addresses. Switches 600 and 602 operate as before, under control of the parity bit y (not shown).

Although the output states y0X 614 and ȳ0X 622 of trellis 608 have the same parity as input states 612 and 620, respectively, the output states 614 and 622 can have a different MSB from input states 612 and 620 depending on the value of y. Therefore, we need switches 600 and 602 to save the path-metrics of 614, 622, 626, and 634 to the MSB partitioned path-metric locations.

FIG. 15B is a logical diagram showing another implementation of the present invention using MSB partitioning. This embodiment also comprises switches 600 and 602, which operates as previously described. Note, however, that in this embodiment, the arrangement of the first memory 604 and second memory 606 are symmetrically reversed from the embodiment shown in FIG. 15A, and that the output from each switch is always fed to the first memory 604 and the second memory 606 associated with its associated partitioned trellis.

The output states 646 and 659 have the same MSB as the input states 644 and 654, respectively. The output states 646 and 659 can have different parities from the input states 644 and 654, respectively. We use switches 600 and 602 to save the path-metrics of 646, 659, 664, and 674 to the parity partitioned path-metric locations.

Conclusion

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of computing a decision bit for an output node associated with an output state in a trellis butterfly, comprising the steps of:

computing a first branch metric between a first input node and the output node, the first input node associated with a first input path metric, wherein the first branch metric defines a difference between an error free first state of a convolutionally coded sequence and a measured first state of the convolutionally coded sequence;

adding the first input path metric to the first branch metric to produce a first candidate output path metric;

computing a second branch metric between a second input node and the output node, the second input node associated with a second input path metric wherein the second branch metric defines a difference between an error free second state of the convolutionally coded sequence and a measured second state of the convolutionally coded sequence;

adding the second input path metric to the second branch metric to produce a second candidate output path metric; and configuring the decision bit designating a path to the output node as a minimum error path based upon a parity of the output node state and upon whether the first candidate output path metric is greater than the second candidate output path metric.

2. The method of claim 1, further comprising the step of setting the output node path metric equal to the lesser of the first candidate output path metric and the second candidate output path metric.

3. The method of claim 2, wherein:

the step of adding the first input path metric to the first branch metric comprises the step reading the first input path metric from a first memory associated with the first input node; and the step of adding the second input path metric to the second branch metric comprises the step of reading the second input path metric from a second memory associated with the second input node.

4. The method of claim 3 above, further comprising the step of providing the output path metric to the first memory and the second memory.

5. The method of claim 1, wherein the step of configuring the decision bit comprises the steps of:

comparing the first candidate output path metric and the second candidate output path metric to determine whether the first candidate output path metric is larger than the second candidate output path metric; setting a comparison variable according to whether the first candidate output path metric is larger than the second candidate output path metric;

determining the value of a parity variable y such that Xy is of even parity, wherein X is the output node state; and setting the decision bit when a logical exclusive or relationship between the comparison variable and the parity variable is established.

6. An apparatus for computing a decision bit for an output node associated with an output state in a trellis butterfly, comprising:

means for computing a first branch metric between a first input node and the output node, the first input node associated with a first input path metric, wherein the first branch metric defines a difference between an error free first state of a convolutionally coded sequence and a measured first state of the convolutionally coded sequence;

means for adding the first input path metric to the first branch metric to produce a first candidate output path metric;

means for computing a second branch metric between a second input node and the output node, the second input node associated with a second input path metric wherein the second branch metric defines a difference between an error free second state of the convolutionally coded sequence and a measured second state of the convolutionally coded sequence;

means for adding the second input path metric to the second branch metric to produce a second candidate output path metric; and means for configuring the decision bit designating a path to the output node as a minimum error path based upon a parity of the output node state and upon whether the first candidate output path metric is greater than the second candidate output path metric.

7. The apparatus of claim 6, further comprising means for setting the output node path metric equal to the lesser of the first candidate output path metric and the second candidate output path metric.

8. The apparatus of claim 7, wherein:

the means for adding the first input path metric to the first branch metric comprises means for reading the first input path metric from a first memory associated with the first input node; and the means for adding the second input path metric to the second branch metric comprises means for reading the second input path metric from a second memory associated with the second input node.

9. The apparatus of claim 8, further comprising means for providing the output path metric to the first memory and the second memory.

10. The apparatus of claim 6, wherein the means for configuring the decision bit comprises:

comparing the first candidate output path metric and the second candidate output path metric to determine whether the first candidate output path metric is larger than the second candidate output path metric; setting a comparison variable according to whether the first candidate output path metric is larger than the second candidate output path metric;

determining the value of a parity variable y such that Xy is of even parity, wherein X is the output node state; and setting the decision bit when a logical exclusive or relationship between the comparison variable and the parity variable is established.

11. An decision bit calculation device, comprising:

a first memory for storing a first input path metric for a first trellis input node and a fourth input path metric for an fourth trellis input node;

a second memory for storing a second input path metric for a second trellis input node and a third input path metric for a third trellis input node;

a first adder, coupled directly to the first memory and a first branch metric calculator, for adding the first input path metric and the first branch metric to produce a first candidate output node metric;

a second adder, coupled to the second memory and a second branch metric calculator, for adding the second input path metric and the second branch metric to produce a second candidate output node metric;

a comparator for comparing an output of the first adder and an output of the second adder to generate a comparator signal indicating whether the first output node metric is greater than the second output node metric; and a decision bit controller for selecting toggling a decision bit based upon the signal indicating whether the first output node metric is greater than the second output node metric and upon a parity of first output node and the second output node.

12. The decision bit calculation device of claim 11, wherein the first adder is coupled directly to the first memory and the second adder is coupled directly to the second memory.

13. The decision bit calculation device of claim 11, wherein the decision bit controller comprises an exclusive or gate coupled to the comparator signal and to a parity input, wherein the parity input has a logical state such that Xy is of even parity and X is an output node state.

14. The decision bit calculation device of claim 11, further comprising means for setting an output node path metric equal to the lesser of the first candidate output path metric and the second candidate output path metric.

15. A program storage device, readable by computer, tangibly embodying one or more programs of instructions executable by the computer to perform method steps of computing a decision bit for an output node associated with an output state in a trellis butterfly, the method steps comprising the steps of:

computing a first branch metric between a first input node and the output node, the first input node associated with a first input path metric, wherein the first branch metric defines a difference between an error free first state of a convolutionally coded sequence and a measured first state of the convolutionally coded sequence;

adding the first input path metric to the first branch metric to produce a first candidate output path metric;

computing a second branch metric between a second input node and the output node, the second input node associated with a second input path metric wherein the second branch metric defines a difference between an error free second state of the convolutionally coded sequence and a measured second state of the convolutionally coded sequence;

adding the second input path metric to the second branch metric to produce a second candidate output path metric; and configuring the decision bit designating a path to the output node as a minimum error path based upon a parity of the output node state and upon whether the first candidate output path metric is greater than the second candidate output path metric.

16. The program storage device of claim 15, wherein the method step of setting the output node path metric equal to the lesser of the first candidate output path metric and the second candidate output path metric.

17. The program storage device of claim 16, wherein:

the method step of adding the first input path metric to the first branch metric comprises the method step reading the first input path metric from a first memory associated with the first input node; and the method step of adding the second input path metric to the second branch metric comprises the method step of reading the second input path metric from a second memory associated with the second input node.

18. The program storage device of claim 17, wherein the method steps further comprise the step of providing the output path metric to the first memory and the second memory.

19. The program storage device of claim 15, wherein the method step of configuring the decision bit comprises the method steps of:

comparing the first candidate output path metric and the second candidate output path metric to determine whether the first candidate output path metric is larger than the second candidate output path metric; setting a comparison variable according to whether the first candidate output path metric is larger than the second candidate output path metric;

determining the value of a parity variable y such that Xy is of even parity, wherein X is the output node state; and setting the decision bit when a logical exclusive or relationship between the comparison variable and the parity variable is established.

* * * * *

UNITED STATES PATENT AND TRADEMARK OFFICE
CERTIFICATE OF CORRECTION

PATENT NO.   : 6,163,581
DATED        : December 19, 2000
INVENTOR(S)  : Inyup Kang It is certified that error appears in the above-identified patent and that said Letters Patent is hereby corrected as shown below:

<u>Column 8,</u>
Line 44, "208" should read -- 210 --;
Line 47, "208" should read -- 210 --.

<u>Column 9,</u>
Line 35, "unit" should read -- circuit --;
Line 39, "unit" should read -- circuit --.

Signed and Sealed this

Eighth Day of October, 2002

Attest:

JAMES E. ROGAN
Attesting Officer       Director of the United States Patent and Trademark Office